United States Patent

Stenström et al.

[11] Patent Number: 5,822,340
[45] Date of Patent: Oct. 13, 1998

[54] METHOD FOR DECODING DATA SIGNALS USING FIXED-LENGTH DECISION WINDOW

[75] Inventors: Sven Erik Nikias Stenström; Karin Cecilia Johansson, both of Lund, Sweden

[73] Assignee: Telefonaktiebolaget LM Ericsson, Sweden

[21] Appl. No.: 644,574

[22] Filed: May 10, 1996

[51] Int. Cl.[6] .................................................. G06F 11/10
[52] U.S. Cl. ................................................ 371/43; 371/6
[58] Field of Search ............................. 371/93, 6, 38.1; 375/94, 340

[56] References Cited

U.S. PATENT DOCUMENTS

| 5,229,767 | 7/1993 | Winter et al. | 341/50 |
|---|---|---|---|
| 5,331,666 | 7/1994 | Dent | 375/94 |
| 5,414,738 | 5/1995 | Bienz | 375/341 |
| 5,432,821 | 7/1995 | Polydoros et al. | 375/340 |
| 5,497,384 | 3/1996 | Fredrickson et al. | 371/43 |

FOREIGN PATENT DOCUMENTS

| 0 210 932 | 2/1987 | European Pat. Off. |
| 0 391 354 | 10/1990 | European Pat. Off. |
| 0 060 724 | 7/1994 | European Pat. Off. |
| 0 606 724 | 7/1994 | European Pat. Off. |

OTHER PUBLICATIONS

Nill et al., "List and Soft Symobl Output Viterbi Algorithms: Extensions and Comparisons", IEEE Transactions on Communications, vol. 43, No. 2/3/4, Feb./Mar./Apr., pp. 227–287, 1995.

"List and Soft Symbol Output Viterbi Algorithms: Extensions and Comparisons", Nill et al., IEEE Transactions on Communications, vol. 43, No. 2/3/4, Feb./Mar./Apr. 1995, pp. 277–287.

*Primary Examiner*—Reba I. Elmore
*Assistant Examiner*—McDieunel Marc
*Attorney, Agent, or Firm*—Burns, Doane, Swecker & Mathis, L.L.P.

[57] ABSTRACT

A method for decoding a transmitted data sequence using a full-length decision window, such as in a trellis decoder, in which transition paths have converged. Transition paths within the decision window and their associated soft values are compared with a stored candidate for the next best path and associated stored soft value. Based on the comparison, and whether the transition paths and the best path have merged during the decision window, the decision window is shifted or the stored candidate for the next best transition path and associated stored soft value are replaced by the possible candidate for the next best path and associated soft value. The decision window is then shifted.

16 Claims, 2 Drawing Sheets

METHOD FOR DECODING DATA SIGNALS USING FIXED-LENGTH DECISION WINDOW

FIELD OF THE INVENTION

The present invention generally relates to the decoding of encoded data communication signals. More particularly, the present invention relates to an improved decoding method using a fixed-length decision window.

BACKGROUND OF THE INVENTION

A conventional digital communication system is illustrated in FIG. 1. Information source 10 supplies analog or digital information to a source encoder 11 which encodes the information into an information sequence x. Channel encoder 12 transforms the information sequence x into a new information sequence by efficiently introducing redundancy into the information sequence to improve the reliability of the transmission. The redundancy can be used, for example, for error detection by the receiver, error correction at the receiver, and to implement an automatic repeat request, where the detection of an error by the receiver will automatically initiate a request for repeated transmission of the data. It will be appreciated that more redundancy is required to correct errors than to detect errors in an encoded message. Modulator 13 receives the encoded sequence from channel encoder 12 and generates channel signals for transmission over a transmission channel 14 using standard modulation techniques such as amplitude, frequency, phase or pulse modulation. In general, transmission channel 14 will exhibit noise and other impairments, such as frequency or phase distortion and a variety of fading characteristics. Digital demodulator 15 receives the transmitted signal over the transmission channel and demodulates the transmitted signal to produce an estimate of the encoded information sequence. Channel decoder 16 then uses the estimate to reproduce the information sequence using the redundant bits supplied by channel encoder 12. Finally, source decoder 17 transforms the reconstructed information sequence into a form suitable for information destination 18.

Channel encoder 12 typically introduces redundancy using one of two common methods: block coding or convolutional coding. An (n,k) block code transforms a block of k information bits into an n-bit codeword by adding n-k parity (redundancy) bits in accordance with a predetermined encoding rule. The n-bit codewords are then transmitted over the communication channel. The code rate, R, is defined as R=k/n. The receiver estimates the original k information bits using the received sequence including the redundancy introduced by the n-k parity bits. Block codes are "memoryless" in that each n-bit codeword output by the decoder depends only on the present k-bit information block.

Convolutional coding is generally performed by organizing a stream of information bits into k-bit blocks, and passing the blocks into a shift register. The shift register stages store up to v groups of k-bit blocks, and the stages are connected to linear algebraic function generators. The generator outputs are selectively combined to produce a coded output of n bits. Convolutional coding is not memoryless, since each encoded block depends not only on the present k-bit block input to the shift register, but also on the v previous message blocks. Thus, a convolutional code has a memory of order v. The code rate R of a convolutional code is R=k/n, and the constraint length on the code is v+1. Typically, k and n are small integers and redundancy is added by increasing the length of the shift register. The operation of convolutional encoders and decoders can be described by either a trellis diagram or a state diagram or table, as is well known in the art.

Decoders, demodulators, equalizers, and other conventional digital communication systems equipment typically use a Viterbi algorithm to estimate transmitted signals which were encoded using convolutional codes, and to minimize the impairments of the communication channel. The Viterbi algorithm generates a maximum likelihood estimation of a single transmitted data sequence by finding the shortest transition path through a sequence of possible states (a "trellis"). The Viterbi algorithm can be generally described as a method in which all possible transmitted sequences are correlated with the received sequence, and then a "survivor" sequence is chosen based on the maximum correlation—i.e., the path with the best "metric" to estimate the received sequence.

The Viterbi algorithm can be improved by generating a reliability indicator for each estimated data bit. The reliability indicator can be the amplitude of the estimated data bit, for example. This enhancement is generally referred to as "soft" information. If concatenated codes are used, the additional soft information can be used by later decoders to enhance the performance of the system.

Further modifications to the Viterbi algorithm are described in European patent application 0 606 724 A1 by Nill et al, and in "List and Soft Symbol Output Viterbi Algorithms: Extensions and Comparisons", Nill et al., IEEE Transaction on Communications, Vol. 43, No.2/3/4, February/March/April 1995. The Nill publications disclose a decoding method which uses soft information and estimated bits to produce a list of candidate sequences in descending order of probability. The list of candidate sequences can be used in later stages to determine the best estimate of the transmitted sequence. For example, a cyclic redundancy check (CRC), such as is used in the Global System for Mobile communications (GSM) radio link protocol, can be used to check the candidate sequences in the list, selecting the first candidate sequence having the correct CRC information. System performance is enhanced by allowing for correction of errors without having to retransmit the erroneous frames.

The Nill method can be described generally as follows. The received symbols are decoded using the Viterbi algorithm to produce an estimate of the most likely data sequence, together with soft information (e.g., a maximum likelihood value). The soft information is used to locate the least likely (weakest) bit in the sequence. Rather than choosing the best incoming transition path (to the state that shifts out the weakest bit), an alternative incoming transition path is determined by back-tracing in the Viterbi trellis. To generate the ranked list of candidate sequences in order of descending probability, each of the l list elements has a candidate for the (l+1)th list element. The (l+1)th list element is chosen as the candidate with the best accumulated metric. These steps are repeated until a sufficient number of alternatives have been created. The Nill method requires the entire Viterbi trellis to be saved, making the Nill method useless for most practical applications.

In the Viterbi algorithm, the trellis tends to converge after a certain amount of time. To use memory more efficiently, it would be desirable to save only a part of the trellis (a decision window). It would therefore be desirable for a practically useful decoding scheme to offer improved performance over the Viterbi algorithm by allocating estimation of multiple data sequences without requiring the storage of the entire trellis.

SUMMARY OF THE INVENTION

The present invention overcomes the above-noted problems, and provides other advantages, by providing a method for decoding transmitted data signals using a fixed-length decision window in which multiple transition paths have converged at a single state. For each state in the decision window, a possible candidate for the second best sequence and associated soft value are determined and compared with a stored candidate for the second best sequence and associated second best soft value. If the soft value (reliability indicator) associated with the possible candidate sequence is lower than the second best soft value associated with the stored candidate sequence, and the possible candidate sequence and the best sequence generated by the Viterbi algorithm converge at a common state within the decision window, the possible candidate for the second best sequence replaces the stored candidate for the second best sequence. The method according to the present invention allows previous soft values and best transition paths to be discarded from memory, so that the entire trellis need not be saved to complete the decoding operation.

BRIEF DESCRIPTION OF THE DRAWINGS

A more complete understanding of the present invention can be obtained by reading the following Detailed Description of the Preferred Embodiments in conjunction with the attached drawings, in which like indicia indicate like elements, and in which.

DETAILED DESCRIPTION OF THE PREFERRED EMBODIMENTS

Figure 2:
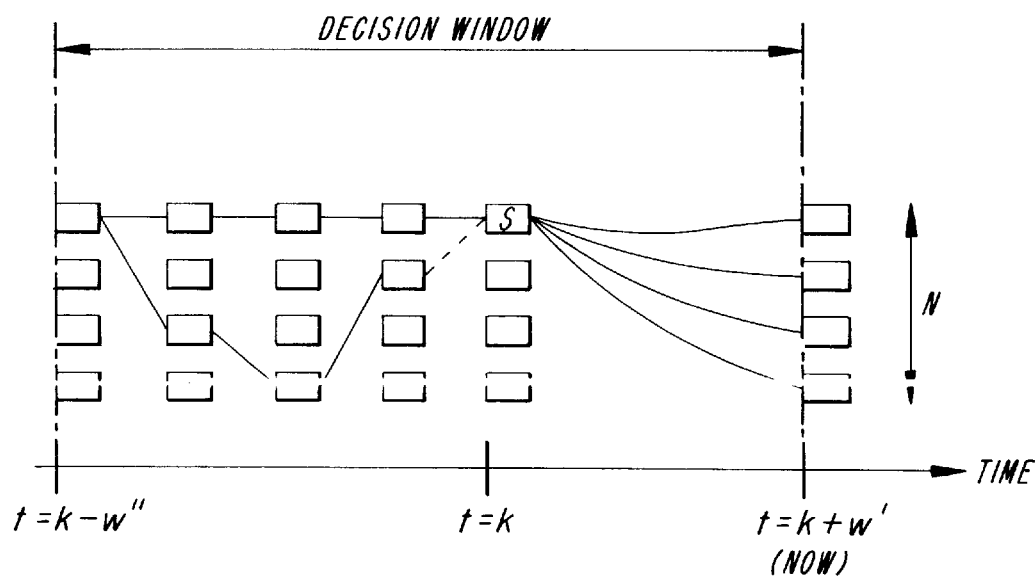
FIG. 2 is a diagram showing a representative decision window in a Viterbi trellis according to an embodiment of the present invention.

Referring now to FIG. 2, a fixed-length decision window of length w"+w' is shown. It can be seen that all the back-trace sequences go through state S. From this state a possible candidate sequence can be produced according to the method of the present invention.

The conventional Viterbi algorithm (VA) estimates the most likely, in a probability sense, transmitted bit sequence. To generate a list of possible alternatives to this sequence, according to the present invention, the following additional information is generated or saved in the decoder:

Information about paths excluded by the VA is saved. This is done for all states between t=k and t=k+w', referring to FIG. 2. The required memory is therefore w'*N*w" bits. The decision of which paths should be saved as second best paths (a decision not made in the conventional VA) is made at t=k+w'. The second best path coming in to each state in the column of state S at t=k+w' is stored until the fixed-length decision window column has been shifted beyond t=k.

A reliability measure, also called a "soft" measure, for each state between t=k and t=k+w' is saved. This reliability measure indicates the certainty of the bit shifted out from this state. The reliability measure can be calculated, for example, as the absolute difference of the accumulated metric between two incoming paths leading up to the same state at time t=k+w'. One path corresponds to a "1" symbol being shifted out, the other path corresponds to a "0" being shifted out. Each time the decision window is shifted, the next best paths and soft values are determined for the new column (the rightmost column in FIG. 2).

A threshold value MINSOFT is generated and used to determine if a possible candidate for an alternative sequence needs to be generated.

To generate alternative sequences within the decision window the conventional VA is performed until the decision window is filled with estimated symbols. After w'+w" bit times (starting at 0), the decision window is full and possible alternative sequences can be derived. Thus, to generate a possible alternative for the best sequence at this time we can exchange the portion of the VA estimated sequence shown in bold in FIG. 2 with an alternative sequence. The conditions for this are:

The bit that is to be shifted out from state S has a soft value less than the current threshold value MINSOFT. That is, this bit is less reliable than other previously decoded bits. State S is determined from the best path at time t=k+w'; and The sequence estimated by the VA (shown in FIG. 2) and the alternative sequence must re-merge within the decision window, i.e. before t=k−w", to achieve proper "termination" of the alternative sequence.

If these conditions are met, a possible alternative sequence should be constructed. This is performed by choosing the other path leading up to state S (shown by the dashed line in FIG. 2) and then back-tracing the trellis. MINSOFT is updated to the soft value of state S and the former candidate for the second best sequence is replaced by the newly found sequence.

When the possible alternative sequence is constructed, it is time to make a new bit decision. The decision window is shifted (to the right in FIG. 2) to make room for the newly received bit. The length of the decision window is constant whether a possible alternative sequence was generated or not. Referring to FIG. 2, the decision window now contains the trellis between t=k−w"+1 and t=k+w'+1. The state S can now be found in the column at t=k+1. The previous explained scheme is performed again to check if a sequence between t=k+1 and t=k−w"+1 (referring to bits in FIG. 2) can be generated. These steps are performed until the trellis is terminated, i.e. all the bits in the present burst has been decoded.

In order to generate two estimates of the transmitted sequence, the best estimation is produced by the conventional VA, and the second best estimation is generated according to the present invention. To generate a list of some number (L) of estimated sequences, the above-described algorithm can be extended to deal with a list of possible candidates for the alternative sequences where the candidate sequences are saved together with their corresponding MINSOFT values. When making the decision whether or not a new candidate sequence is to be generated, the list is checked if the soft value of state S is less than any of the stored MINSOFT values. If this is the case, the generation is performed and the newly found candidate is inserted in the list. The insertion is done to keep the list sorted in terms of increasing MINSOFT values. That is, the list is preferably sorted according to descending probabilities. The decision window is shifted and the procedure is repeated.

Figure 3:
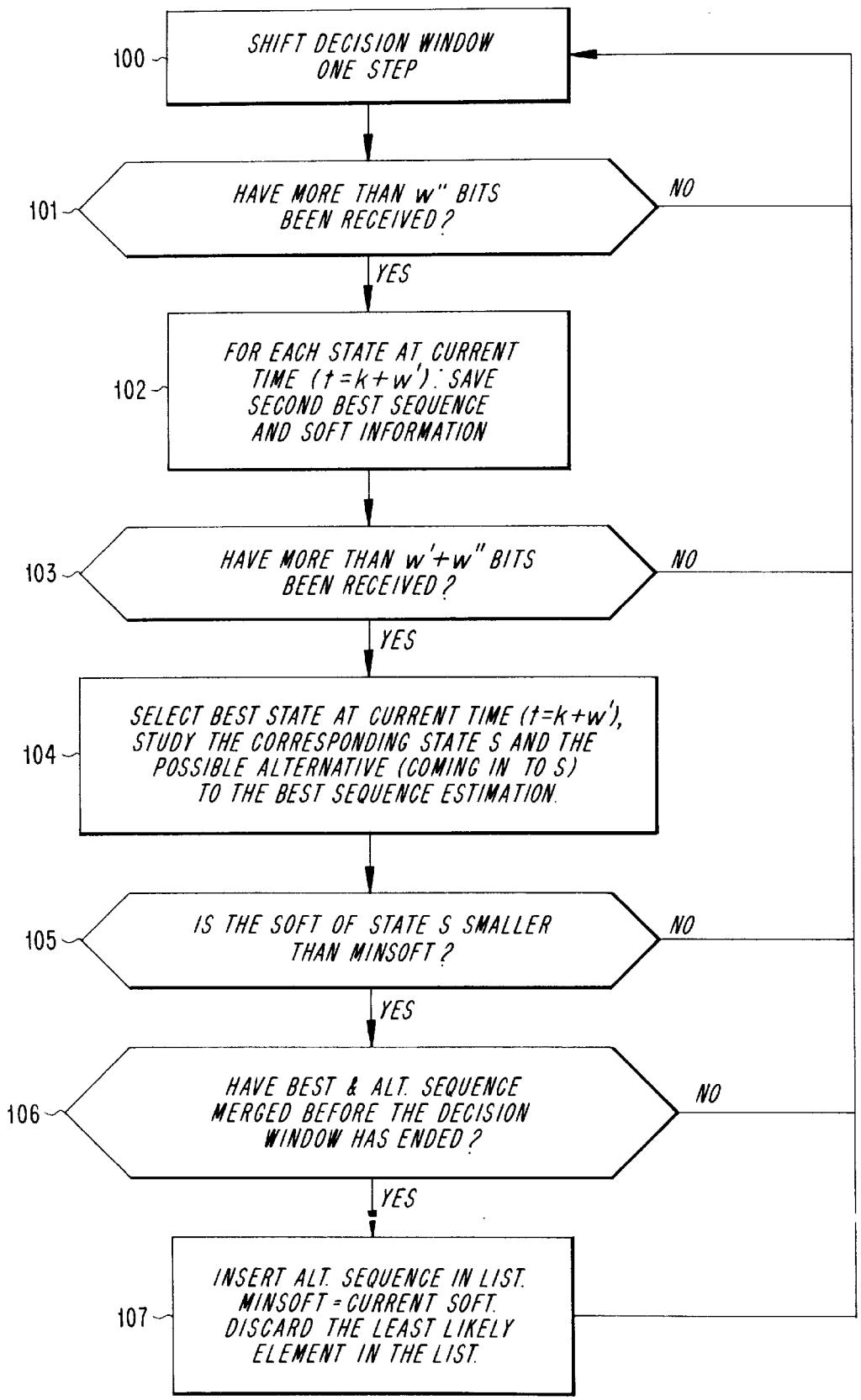
FIG. 3 is a flow chart describing the method according to an embodiment of the present invention.

Referring now to FIG. 3, a flow chart describing the decoding method according to an embodiment of the present invention is shown. The method may be implemented in a decoder, demodulator, equalizer, or other similar device to determine a most likely data sequence from a received, coded data sequence. The flowchart begins in step 100, in which the fixed-length decision window shown in FIG. 2 is updated (shifted), and a conventional VA decoding is performed to determine the best transition path. As shown in FIG. 2, the decision window includes a state in which multiple transition paths have converged at a state at a time t=k, and extends from time t=k forward by a first time or bit offset w' and backward by a second time or bit offset w".

In step 101, it is determined whether more than w" bits have been received by the decoder. Since no alternative sequence differs from the best sequence for up to w" bits, no additional information needs to be saved for the first w" bits.

In step 102, a possible next best transition path, and associated soft information (reliability indicator), is determined for each state at current time t=k+w'. This is performed by back-tracing the trellis to determine the best and second best sequences for each state at t=k+w'. The soft value is calculated as the absolute value of (metric 0-metric 1), where metric 0 and metric 1 are accumulated amplitude measures. In step 103 it is determined whether the decision window is full. If so, in step 104, the state S (state found by back-tracing the trellis from the state at t=k+w' having the best reliability indicator) is selected.

In step 105, the soft information (reliability indicator) SOFT of the state S determined in step 104 is compared to a threshold reliability indicator MINSOFT; if SOFT is not less than MINSOFT, the process returns to step 100 and the fixed-length decision window is shifted and a new best state S is determined. It will be appreciated that if a list of L sequences are estimated, there are (L−1) MINSOFT values.

If SOFT is less than MINSOFT, the method proceeds to step 106, in which it is determined if the best and second best paths have merged at some point before the end of the decision window defined by the time instant k, the time offset w', and the length w" of the next best path. If the best and possible candidate for the next best paths have not merged (that is, the sequences differ in more than w" bits), the process returns to step 100 and the fixed-length decision window is shifted and a new state S is determined. If the best and possible candidate for the next best paths have merged, the value of MINSOFT is set to equal the value of SOFT, the former next best path is discarded from memory, and the new next best path of length w" is saved in step 107.

Figure 1:
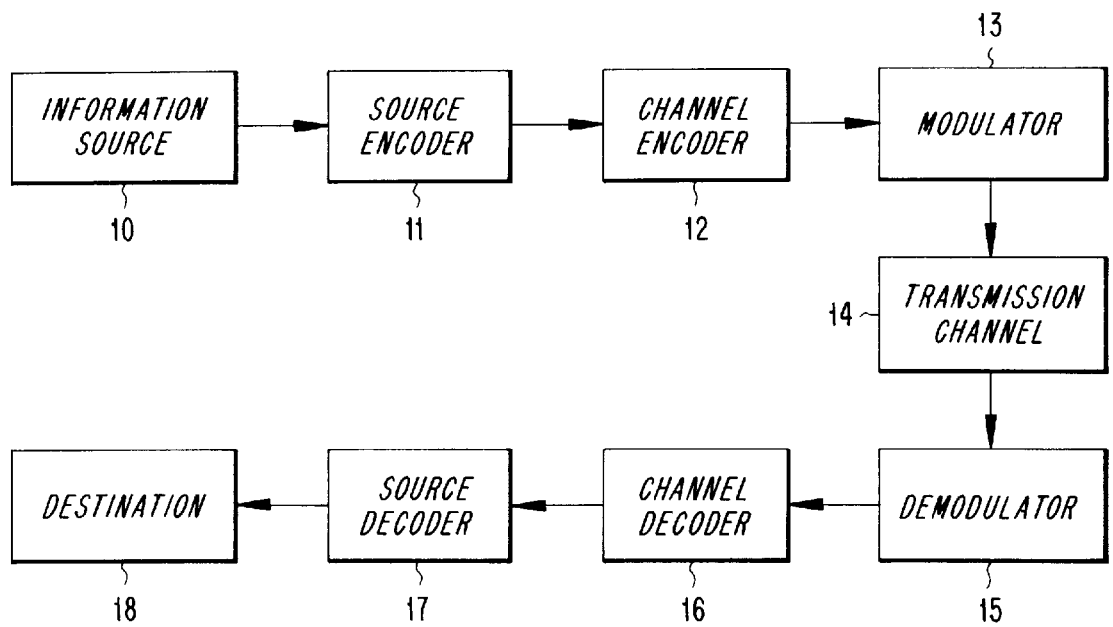
FIG. 1 is a block diagram of a receiver in a conventional communication system in which the method of the present invention can be used.

The above described method can be implemented, for example, in a channel decoder of a GSM system such as the system shown in FIG. 1. The method can be encoded in machine-readable computer code onto a suitable storage medium, such as a computer disk. A typical decision window will have a length of, for example, 31 bits and an offset w' of approximately 14 bits. It will be appreciated that other decision window lengths and offsets w' can be used.

Throughout the foregoing description, the terms "path" and "sequence" have been used interchangeably.

While the foregoing description has included many details and specificities, it is to be understood that these are merely illustrative and are not to be construed as limitations of the present invention. Numerous modifications will be readily apparent to those of ordinary skill in the art which do not depart from the spirit and scope of the invention, as defined by the following claims and their legal equivalents.

What is claimed is:

1. A method for decoding a sequence of transmitted communication signals having encoded data symbols, comprising the steps of:

for each state in a decision window which is a subset of a decoding trellis of a decoder, determining a possible candidate for the next best decoding path and an associated reliability indicator, and comparing each possible candidate for the next best decoding path with a stored best decoding path;

shifting the decision window if the associated reliability indicator is not less than a threshold value or the best decoding path and the possible next best decoding path have not merged during the decision window; and if the associated reliability indicator is less than the threshold value and the best decoding path and the possible next best decoding path have merged during the decision window, defining a new threshold value as the reliability indicator, saving the possible next best decoding path associated with the new threshold value as a new stored candidate for the next best path in a memory, discarding all other next best paths, and shifting the decision window.

2. The method of claim 1, wherein the reliability indicator is based on an amplitude of each decoded symbol in the next best decoding path.

3. The method of claim 1, wherein the decision window is a fixed-length decision window.

4. The method of claim 1, wherein each state in the decision window is decoded using the Viterbi algorithm prior to the step of determining.

5. The method of claim 1, wherein the reliability indicator is calculated as |metric0-metric1|, where metric0 and metric1 are accumulated metric amplitude measures of sequential decoded symbols.

6. The method of claim 1, wherein the step of determining is performed only after a reception threshold of data symbols has been received by the decoder.

7. The method of claim 1, wherein the step of determining is performed only after all symbols within the decision window have been received by the decoder.

8. The method of claim 1, wherein the stored best decoding path is generated by the Viterbi algorithm.

9. A storage medium encoded with machine-readable computer code for decoding a sequence of transmitted communication signals having encoded data symbols, comprising:

means for determining, for each state in a decision window which is a subset of a decoder trellis, a possible candidate for the next best decoding path and an associated second best reliability indicator, and comparing each possible candidate for the next best decoding path with a stored best decoding path;

means for shifting the decision window if the second best reliability indicator is not less than a threshold reliability value or the best decoding path and the possible next best decoding path have not merged during the decision window; and means for, if the reliability indicator is less than the threshold value and the best decoding path and the possible next best decoding path have merged during the decision window, defining a new threshold reliability value as the reliability indicator, saving the possible next best path associated with the new threshold reliability value in a memory, discarding all other next best paths, and shifting the decision window.

10. The storage medium of claim 9, wherein the reliability indicator is based on an amplitude of each decoded symbol in the next best decoding path.

11. The storage medium of claim 9, wherein the decision window is a fixed-length decision window.

12. The storage medium of claim 9, wherein each state in the decision window has been previously decoded using the Viterbi algorithm.

13. The storage medium of claim 9, wherein the reliability indicator is calculated as |metric0-metric1|, where metric0 and metric1 are accumulated metric amplitude measures of sequential decoded symbols.

14. The storage medium of claim 9, wherein the means for determining functions only after a threshold of data symbols has been received by the decoder.

15. The storage medium of claim 9, wherein the means for determining functions only after all symbols within the decision window have been received by the decoder.

16. The storage medium of claim 9, wherein the stored best decoding path is generated by the Viterbi algorithm.

* * * * *